(12) United States Patent
Bell et al.

(10) Patent No.: US 7,489,587 B2
(45) Date of Patent: *Feb. 10, 2009

(54) SEMICONDUCTOR MEMORY DEVICE CAPABLE OF CONTROLLING CLOCK CYCLE TIME FOR REDUCED POWER CONSUMPTION

(75) Inventors: Debra M. Bell, Boise, ID (US); Paul A. Silvestri, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 59 days.

This patent is subject to a terminal disclaimer.

(21) Appl. No.: 11/458,631

(22) Filed: Jul. 19, 2006

(65) Prior Publication Data

US 2006/0250859 A1 Nov. 9, 2006

Related U.S. Application Data

(63) Continuation of application No. 10/147,146, filed on May 16, 2002, now Pat. No. 7,319,728.

(51) Int. Cl.
*G11C 8/18* (2006.01)
*H03L 7/06* (2006.01)

(52) U.S. Cl. .............................. 365/233.12; 365/233.13; 365/194; 365/227; 365/230.02; 327/156; 327/158; 327/161; 327/149; 327/152; 327/153

(58) Field of Classification Search ................ 365/227, 365/233, 194, 191, 189.07, 230.02, 233.12, 365/233.13, 233.1; 327/155, 156, 158, 161, 327/149, 152, 153
See application file for complete search history.

(56) References Cited

U.S. PATENT DOCUMENTS

| | | | |
|---|---|---|---|
| 3,955,158 A | 5/1976 | Upadhyayula et al. |
| 3,993,957 A | 11/1976 | Davenport |
| 5,691,660 A | 11/1997 | Busch et al. |
| 5,717,353 A | 2/1998 | Fujimoto |
| 5,930,182 A | 7/1999 | Lee |
| 5,946,244 A | 8/1999 | Manning |
| 6,002,281 A | 12/1999 | Jones et al. |
| 6,081,462 A | 6/2000 | Lee |
| 6,085,345 A | 7/2000 | Taylor |

(Continued)

OTHER PUBLICATIONS

Jang, Seong-Jin, et al., "A Compact Ring Delay Line for High Speed Synchronous DRAM", *IEEE 1998 Symposium on VLSI Circuits Digest of Technical Papers*, (Jun. 11-13, 1998),60-61.

(Continued)

*Primary Examiner*—Andrew Q Tran
(74) *Attorney, Agent, or Firm*—Schwegman, Lundberg & Woessner, P.A.

(57) ABSTRACT

Some embodiments of the invention include a delay locked loop having a delay line for delaying an input signal. The input signal is generated from a first signal. A delay controller controls the delay line to adjust the timing relationship between the first signal and an internal signal. The delay locked loop also includes cycle control circuitry for controlling the cycle time of the signal entering the delay line and the cycle time of the signal exiting the delay line.

14 Claims, 14 Drawing Sheets

U.S. PATENT DOCUMENTS

| | | | |
|---|---|---|---|
| 6,088,255 | A | 7/2000 | Matsuzaki et al. |
| 6,108,793 | A | 8/2000 | Fujii et al. |
| 6,172,537 | B1 | 1/2001 | Kanou et al. |
| 6,181,174 | B1 | 1/2001 | Fujieda et al. |
| 6,184,753 | B1 | 2/2001 | Ishimi et al. |
| 6,219,384 | B1 | 4/2001 | Kliza et al. |
| 6,275,079 | B1 | 8/2001 | Park |
| 6,292,040 | B1 | 9/2001 | Iwamoto et al. |
| 6,313,676 | B1 | 11/2001 | Abe et al. |
| 6,316,976 | B1 | 11/2001 | Miller, Jr. et al. |
| 6,374,360 | B1 | 4/2002 | Keeth et al. |
| 6,378,079 | B1 | 4/2002 | Mullarkey |
| 6,381,194 | B2 | 4/2002 | Li |
| 6,385,129 | B1 | 5/2002 | Silvestri |
| 6,388,480 | B1 | 5/2002 | Stubbs |
| 6,414,903 | B1 | 7/2002 | Keeth et al. |
| 6,421,789 | B1 | 7/2002 | Ooishi |
| 6,421,801 | B1 | 7/2002 | Maddux et al. |
| 6,438,060 | B1 | 8/2002 | Li |
| 6,446,180 | B2 | 9/2002 | Li et al. |
| 6,456,130 | B1 | 9/2002 | Schnell |
| 6,476,653 | B1 | 11/2002 | Matsuzaki |
| 6,492,852 | B2 | 12/2002 | Fiscus |
| 6,600,912 | B1 | 7/2003 | Stepp et al. |
| 6,605,969 | B2 | 8/2003 | Mikhalev et al. |
| 6,621,317 | B2 * | 9/2003 | Saeki ................... 327/163 |
| 6,771,103 | B2 | 8/2004 | Watanabe et al. |
| 6,876,594 | B2 | 4/2005 | Griesmer et al. |
| 6,937,076 | B2 * | 8/2005 | Gomm ................... 327/158 |
| 7,212,057 | B2 | 5/2007 | Gomm et al. |
| 7,319,728 | B2 * | 1/2008 | Bell et al. ................... 375/354 |
| 7,378,891 | B2 | 5/2008 | Gomm et al. |
| 2002/0017939 | A1 | 2/2002 | Okuda et al. |
| 2002/0130691 | A1 | 9/2002 | Silvestri |
| 2003/0011414 | A1 | 1/2003 | Bell |
| 2003/0012320 | A1 | 1/2003 | Bell |
| 2003/0179639 | A1 | 9/2003 | Bell et al. |
| 2003/0214334 | A1 | 11/2003 | Gomm et al. |
| 2003/0214338 | A1 | 11/2003 | Silvestri |
| 2003/0215040 | A1 * | 11/2003 | Bell et al. ................... 375/376 |
| 2005/0242850 | A1 * | 11/2005 | Kawasaki ................... 327/155 |
| 2007/0075763 | A1 | 4/2007 | Gomm et al. |

OTHER PUBLICATIONS

Kim, Jae J., et al., "A low-jitter mixed-mode DLL for high-speed DRAM applications", *IEEE Journal of Solid State Circuits, 35(10)*, (Oct. 2000), 1430-1436.

Tamura, H., et al., "Partial response detection technique for driver power reduction in high speed memory-to-processor communications", *IEEE International Solid-State Circuits Conference, 1997. Digest of Technical Papers*. 44th ISSCC., (1997),342-343, 482.

U.S. Appl. No. 10/147,146, Final Office Action mailed Mar. 7, 2006, 12 pgs.

U.S. Appl. No. 10/147,146, Final Office Action mailed Jul. 10, 2007, 29 pgs.

U.S. Appl. No. 10/147,146, Non Final Office Action mailed Jan. 10, 2007, 25 pgs.

U.S. Appl. No. 10/147,146, Non Final Office Action mailed Jun. 29, 2006, 18 pgs.

U.S. Appl. No. 10/147,146, Non Final Office Action mailed Sep. 20, 2005, 12 pgs.

U.S. Appl. No. 10/147,146, Notice of Allowance mailed Aug. 24, 2007, NOAR,8 pgs.

U.S. Appl. No. 10/147,146, Response filed Apr. 10, 2007 to Non Final Office Action mailed Jan. 10, 2007, 21 pgs.

U.S. Appl. No. 10/147,146, Response filed Jun. 7, 2006 to Final Office Action mailed Mar. 7, 2006, 25 pgs.

U.S. Appl. No. 10/147,146, Response filed Aug. 8, 2007 to Final Office Action mailed Jul. 10, 2007, 16 pgs.

U.S. Appl. No. 10/147,146, Response filed Sep. 28, 2006 to Non Final Office Action mailed Jun. 29, 2006, 21 pgs.

U.S. Appl. No. 10/147,146, Response filed Dec. 12, 2005 to Non Final Office Action mailed Sep. 20, 2005, 23 pgs.

U.S. Appl. No. 10/147,657, Non-Final Office Action mailed May 8, 2003, 10 pgs.

U.S. Appl. No. 10/147,657, Notice of Allowance mailed Nov. 4, 2003, 7 pgs.

U.S. Appl. No. 10/147,657, Notice of Allowance mailed Mar. 9, 2004, 7 pgs.

U.S. Appl. No. 10/147,657, Notice to allowance mailed May 18, 2004, 7 pgs.

U.S. Appl. No. 10/147,657, Response filed Aug. 8, 2003 to Office Action mailed May 3, 2003, 14 pgs.

U.S. Appl. No. 10/771,611, Amendment Under 37 CFR 1.312 filed Nov. 7, 2006, 14 pgs.

U.S. Appl. No. 10/771,611, Non Final office action mailed Mar. 23, 2005, 9 pgs.

U.S. Appl. No. 10/771,611, Non Final office action mailed Apr. 5, 2006, 6 pgs.

U.S. Appl. No. 10/771,611, Non Final action mailed Oct. 19,2005, 8 pgs.

U.S. Appl. No. 10/771,611, Notice of allowance mailed Sep. 7, 2006, 7 pgs.

U.S. Appl. No. 10/771,611, Response filed Jul. 5, 2006 to non final action mailed Apr. 5, 2006, 14 pgs.

U.S. Appl. No. 11/606,757, Non-Final Office Action received Apr. 23, 2007, 6 pgs.

U.S. Appl. No. 11/606,757,Notice of Allowance mailed Jul. 12, 2007, 8 Pgs.

U.S. Appl. No. 11/606,757, Response filed Jun. 20, 2007 to Non Final Office Action received Apr. 23, 2007, 11 pgs.

* cited by examiner

SEMICONDUCTOR MEMORY DEVICE CAPABLE OF CONTROLLING CLOCK CYCLE TIME FOR REDUCED POWER CONSUMPTION

This application is a Continuation of U.S. application Ser. No. 10/147,146, filed May 16, 2002 now U.S. Pat. No. 7,319,728, which is incorporated herein by reference.

FIELD

The embodiments of the invention relate generally to integrated circuits, and in particular to delay locked loops.

BACKGROUND

Delay locked loops (DLL) reside in many integrated circuits for delaying an external signal to obtain an internal signal. The internal signal usually serves as a reference signal for the integrated circuits instead of the external signal because the internal signal matches internal operating conditions of the integrated circuits, such as process, voltage, and temperature, better than the external signal does.

A typical DLL has number of delay elements, forming a delay line. The external signal propagates through a certain number of activated delay elements in the delay line to become the internal signal. The activated delay elements toggle (switch) in every cycle of the external signal. Each delay element consumes power when it toggles. The power consumption is proportional to the number of toggles. In some cases, improving the power consumed by the DLL is necessary.

DESCRIPTION OF EMBODIMENTS

The following description and the drawings illustrate specific embodiments of the invention sufficiently to enable those skilled in the art to practice the embodiments of the invention. Other embodiments may incorporate structural, logical, electrical, process, and other changes. Examples merely typify possible variations. Portions and features of some embodiments may be included in or substituted for those of others. The scope of the invention encompasses the full ambit of the claims and all available equivalents.

Figure 1:
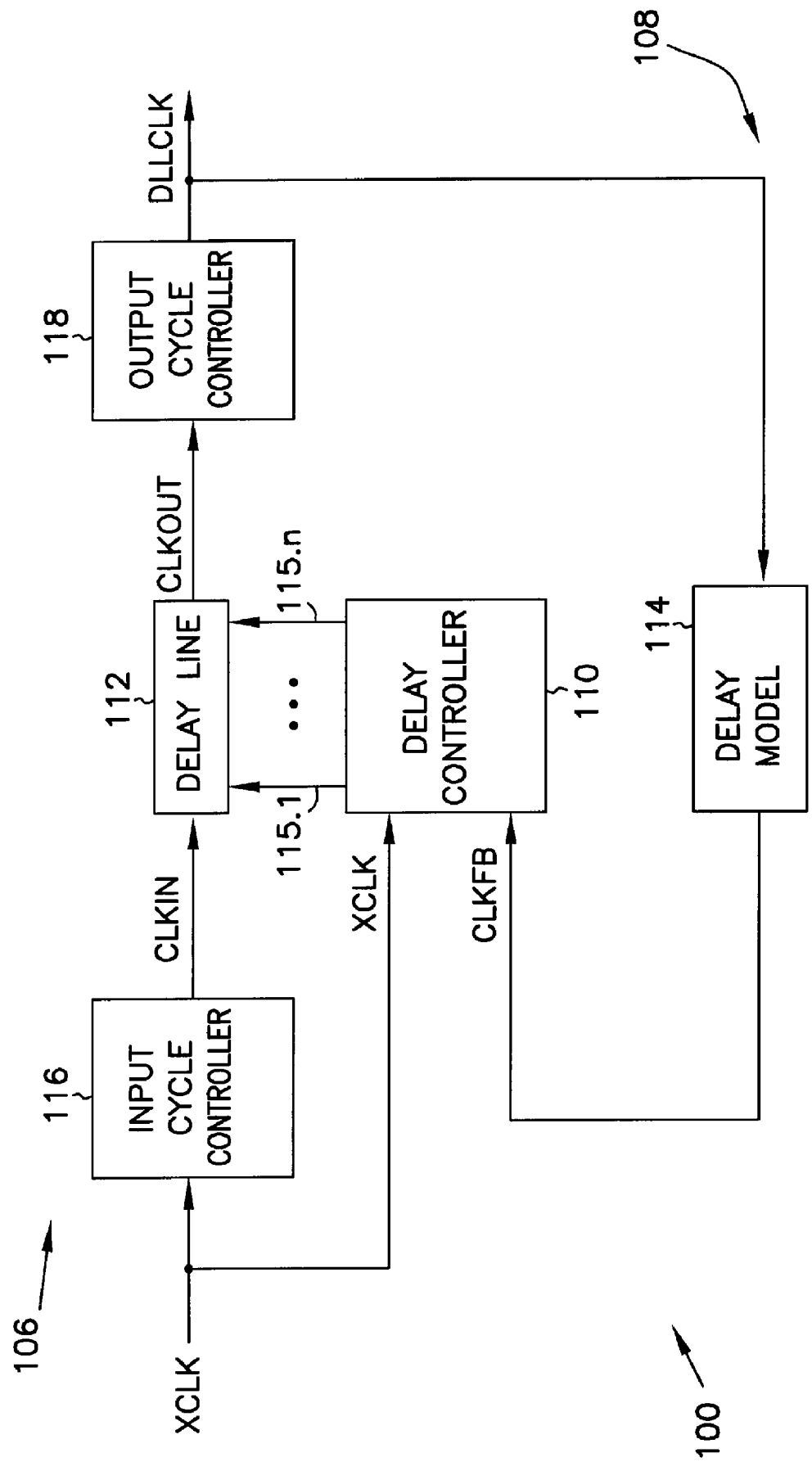
FIG. 1 shows a delay locked loop circuit according to an embodiment of the invention.

FIG. 1 shows a DLL according to an embodiment of the invention. DLL 100 includes a forward path 106 for receiving an external signal XCLK to generate an internal signal DLLCLK. A feedback path 108 provides a feedback signal CLKFB based on a signal from forward path 106. A delay controller 110 compares the XCLK and CLKFB signals to keep the XCLK and DLLCLK signals synchronized. Forward path 106 has a delay line 112 for applying a delay to an input signal CLKIN to produce an output signal CLKOUT. An input cycle controller 116 controls a cycle time of the CLKIN signal, entering delay line 112. An output cycle controller 118 modifies a cycle time of the CLKOUT signal, exiting delay line 112. Controlling the cycle time of the CLKIN signal controls the power consumption of delay line 112.

Input cycle controller 116 controls the cycle time of the CLKIN signal by increasing the cycle time of the XCLK signal. This reduces the number of edges of the CLKIN signal propagating through delay line 112. When the number of edges is reduced, the number of toggles of delay elements in delay line 112 is decreased. When the number of toggles decreases, the power consumption of delay line 112 decreases.

In some embodiments, output cycle controller 118 decreases the cycle time of the CLKOUT signal to restore the cycle time of the XCLK signal so that the DLLCLK and XCLK signals have an equal cycle time.

Feedback path 108 has a delay model 114 for delaying the DLLCLK signal to provide a feedback signal CLKFB. This feedback signal is a version of the DLLCLK signal.

Delay controller 110 compares the XCLK and CLKFB signals to determine a delay between the XCLK and DLLCLK signals. Based on the comparison, delay controller 110 selects tap lines 115.1-115.n to adjust the delay. Each tap line corresponds to a different delay. When the XCLK and DLLCLK signals are synchronized, delay controller 110 stops adjusting the delay and locks the DLL to keep the XCLK and DLLCLK signals synchronized.

Figure 2:
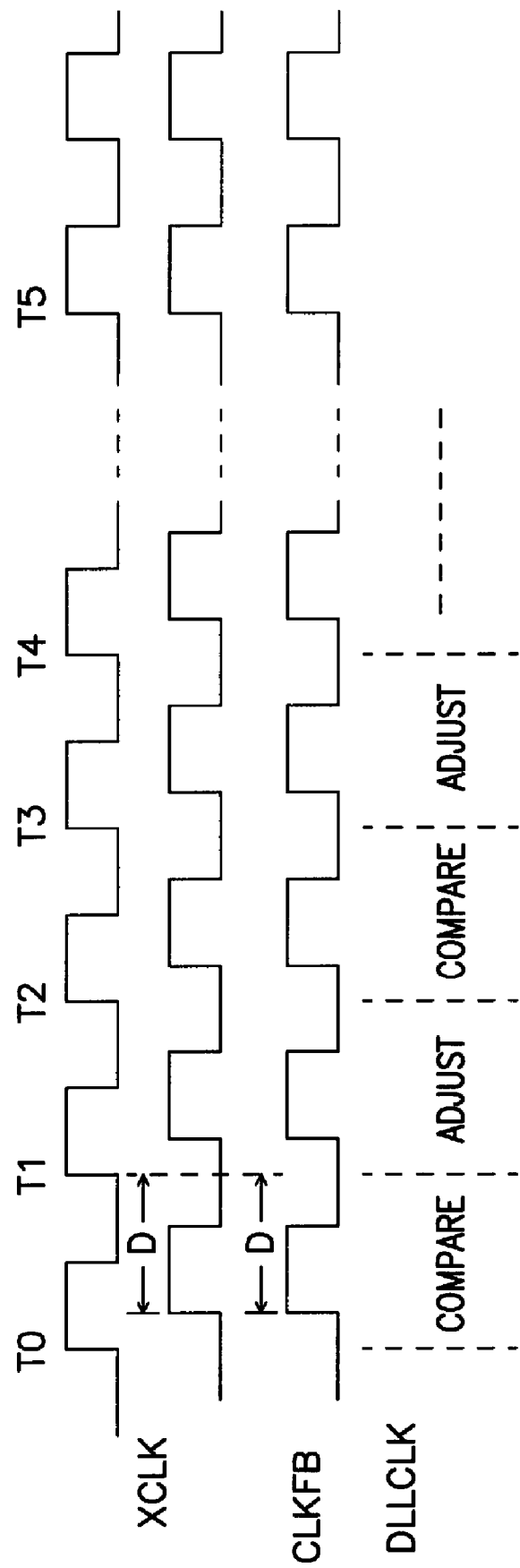
FIG. 2 shows an example of a timing diagram for FIG. 1.

FIG. 2 shows an example of a timing diagram for FIG. 1. At time T0, delay controller 110 compares (COMPARE) the edges of the XCLK and CLKFB signals and detects a delay D. The presence of delay D indicates that the XCLK and DLLCLK signals are not synchronized. At time T1, delay controller 110 selects an appropriate tap to adjust (ADJUST) the delay applied by delay line 112 to change the timing of the DLLCLK and the CLKFB signals. Between times T2 and T4, delay controller 110 compares the XCLK and CLKFB signals again to adjust the delay to reduce delay D. The comparison and adjustment process repeats between times T4 and T5. At time T5, the XCLK and DLLCLK signals are synchronized. Delay controller 110 sets DLL 100 in a locked position.

Figure 3:
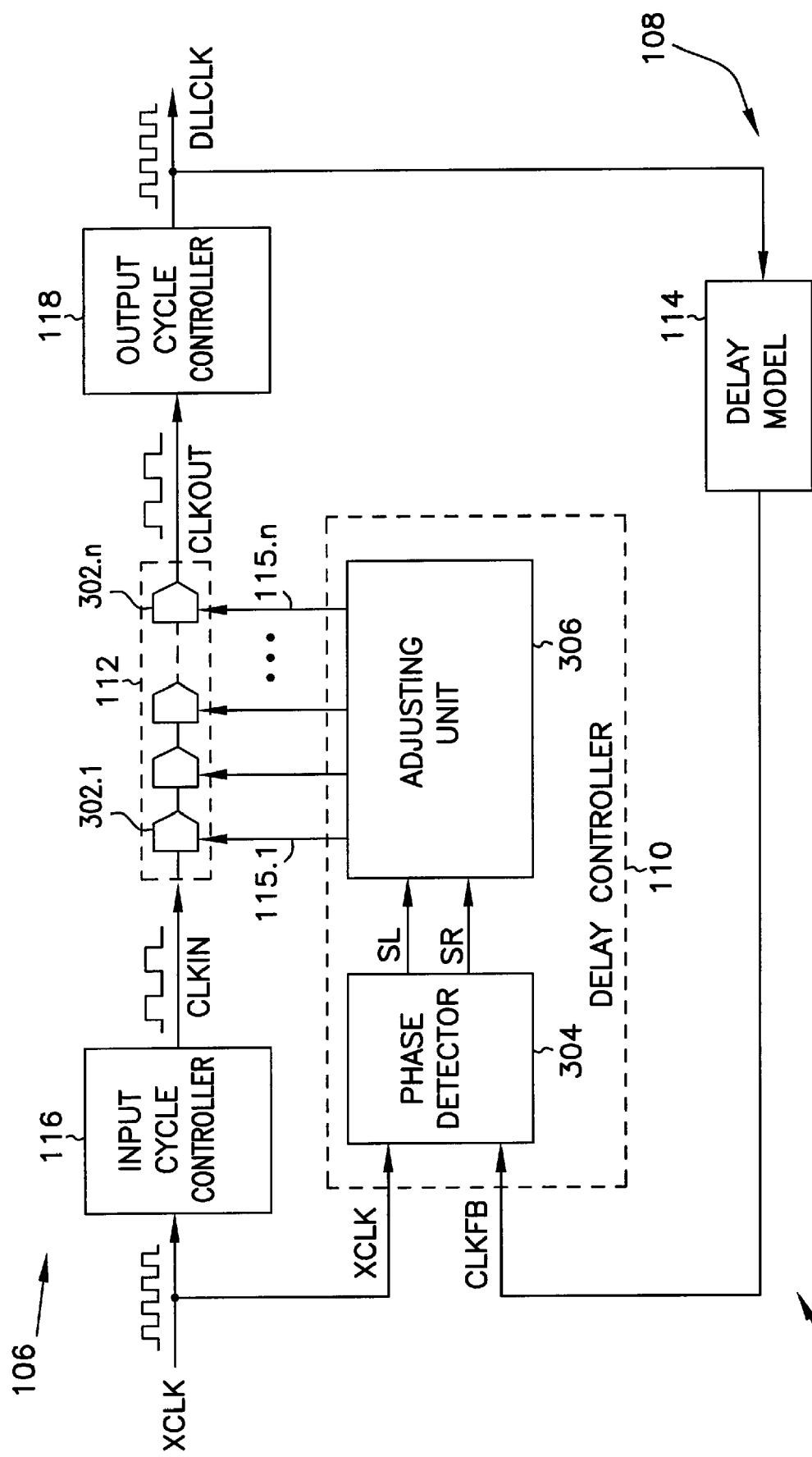
FIG. 3 shows more detail of the delay locked loop circuit of FIG. 1.

FIG. 3 shows more detail of the DLL of FIG. 1. Delay line 112 includes a plurality of delay elements 302.1-302.n, each connecting to a corresponding tap line among the tap lines 115.1-115.n. Each delay element delays a signal for a unit time delay. The delay applied by delay line 112 equals the product of the unit time delay and the number of activated delay elements. When a delay element is activated, it toggles at each edge of the CLKIN signal, allowing the CLKIN signal to propagate through. The CLKIN becomes the CLKOUT signal after propagating through a certain number of activated delay elements. The CLKIN and CLKOUT signals have an equal cycle time.

Delay controller 110 includes a phase detector 304 and an adjusting unit 306. Phase detector 304 compares the XCLK and CLKFB signals and activates shifting signals SR and SL when the XCLK and CLKFB signals are not synchronized. When activated, the SR or SL signal allows adjusting unit 306 to perform a shifting operation for selecting one of the tap lines 115.1-115.n to adjust a delay of delay line 112. In some embodiments, adjusting unit 306 increases the delay when the SR signal is activated and decreases the delay when the SL signal is activated. In other embodiments, adjusting unit 306 acts in the opposite direction, decreasing the delay when the SR signal is activated and increasing the delay when the SL signal is activated. Adjusting unit 306 adjusts the delay until the SR and SL signals are deactivated and the XCLK and CLKFB signals are synchronized.

Delay model 114 is modeled after a combination of input and output cycle controllers 116 and 118 so that when the XCLK and CLKFB signals are synchronized, the XCLK and DLLCLK signals are also synchronized. Delay model 114 has a time delay equal to the sum of a time delay of input cycle controller 116 and a time delay of output cycle controller 118. In some embodiments, delay model 114 has a construction that is identical to the combined constructions of input and output cycle controllers 116 and 118. Since a combination of input and output cycle controllers 116 and 118 and delay model 114 have equal time delay, the CLKFB is a version of the DLLCLK signal. Thus, when the XCLK and CLKFB signals are synchronized, the XCLK and DLLCLK signals are also synchronized.

Input and output cycle controllers 116 and 118 form cycle control circuitry for controlling a cycle time of the CLKIN and DLLCLK signals. Input cycle controller 116 modifies the cycle time of the XCLK signal to control the cycle time of the CLKIN signal. Output cycle controller 118 modifies the cycle time of the CLKOUT signal to control the cycle time of the DLLCLK signal.

Input cycle controller 116 increases the cycle time of the XCLK signal such that the cycle time of the CLKIN signal is greater than the cycle time of the XCLK signal. In some embodiments, input cycle controller 116 increases the cycle time of the XCLK signal such that the cycle time of the CLKIN signal is a multiple of the cycle time of the XCLK signal. Since the cycle time of the CLKIN signal is greater than the cycle time of the XCLK signal, the number of edges of the CLKIN signal is less than the number of edges of the XCLK signal. Hence, the CLKIN signal causes the activated delay elements to toggle fewer times than the XCLK signal would. Thus, propagating the CLKIN signal instead of the XCLK signal into delay line 112 generates fewer number of toggles, thereby reducing the power consumption.

In some embodiments, output cycle controller 118 decreases the cycle time of the CLKOUT signal such that the cycle time of the DLLCLK signal is smaller than the cycle time of the CLKOUT signal. Since the CLKIN and CLKOUT have an equal cycle time, the cycle time of the DLLCLK signal is also smaller than the cycle time of the CLKIN signal. In some embodiments, output cycle controller 118 decreases the cycle time of the CLKOUT signal such that the cycle time of the DLLCLK signal is equal to the cycle time of the XCLK signal.

Figure 4:
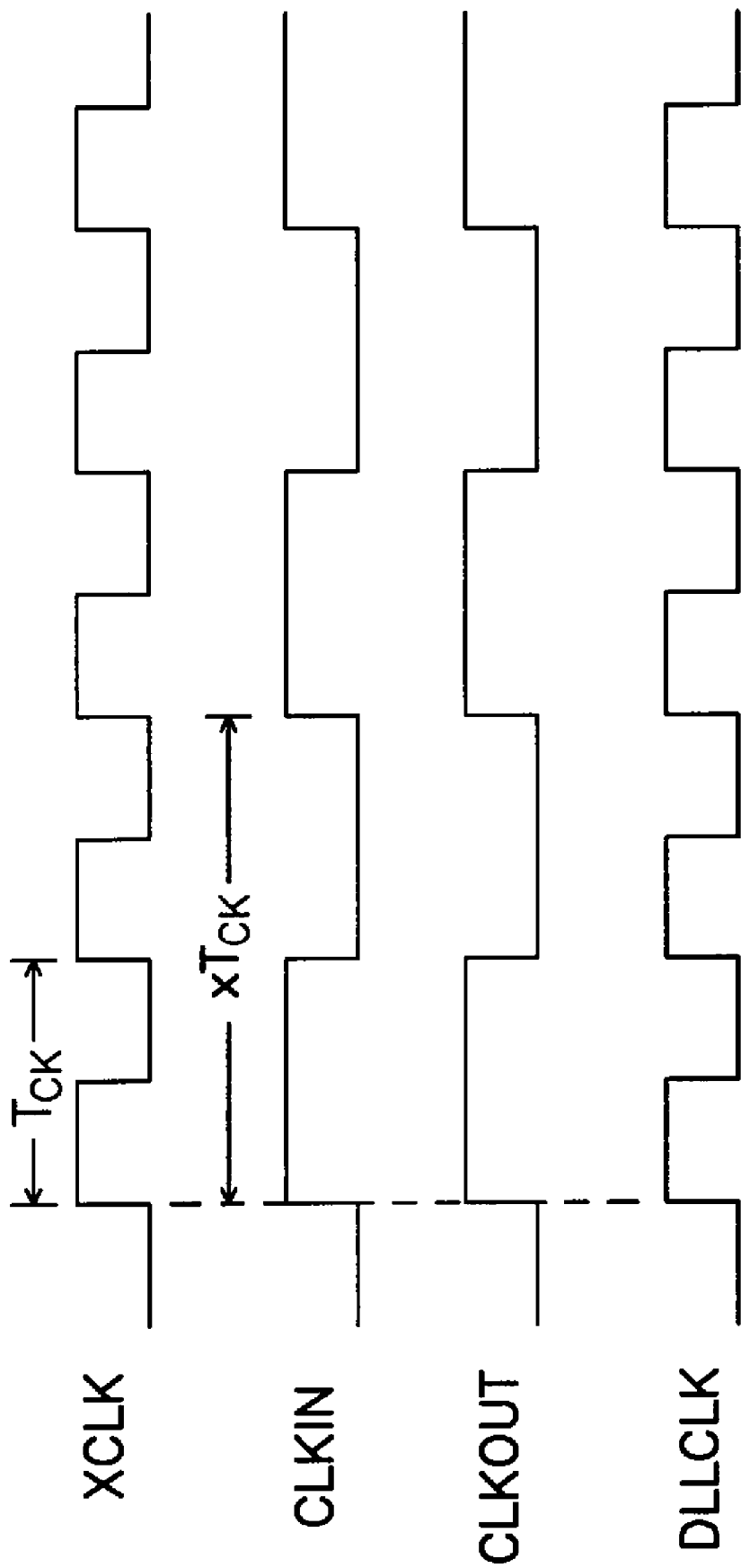
FIG. 4 is a timing diagram of various signals of the DLL of FIG. 3.

FIG. 4 is a timing diagram of various signals of the DLL of FIG. 3. For the purposes of comparison among the cycle times, the signals are lined up in FIG. 4. The XCLK and DLLCLK signals have an equal cycle time of TCK. The CLKIN and CLKOUT signals have an equal cycle time of $xT_{CK}$, where x is greater than one. Therefore, $xT_{CK}$ is greater than $T_{CK}$. In some embodiments, x is an integer. Thus, $xT_{CK}$ is a multiple of $T_{CK}$. In FIG. 4, x is two. Hence, $xT_{CK}$ is twice $T_{CK}$.

Since $xT_{CK}$ is greater than $T_{CK}$, the number of edges of the CLKIN signal is less than the number of edges of the XCLK signal within every cycle of the CLKIN signal. Therefore, propagating the CLKIN signal instead of the XCLK signal into delay line 112 generates fewer number of toggles.

Figure 5:
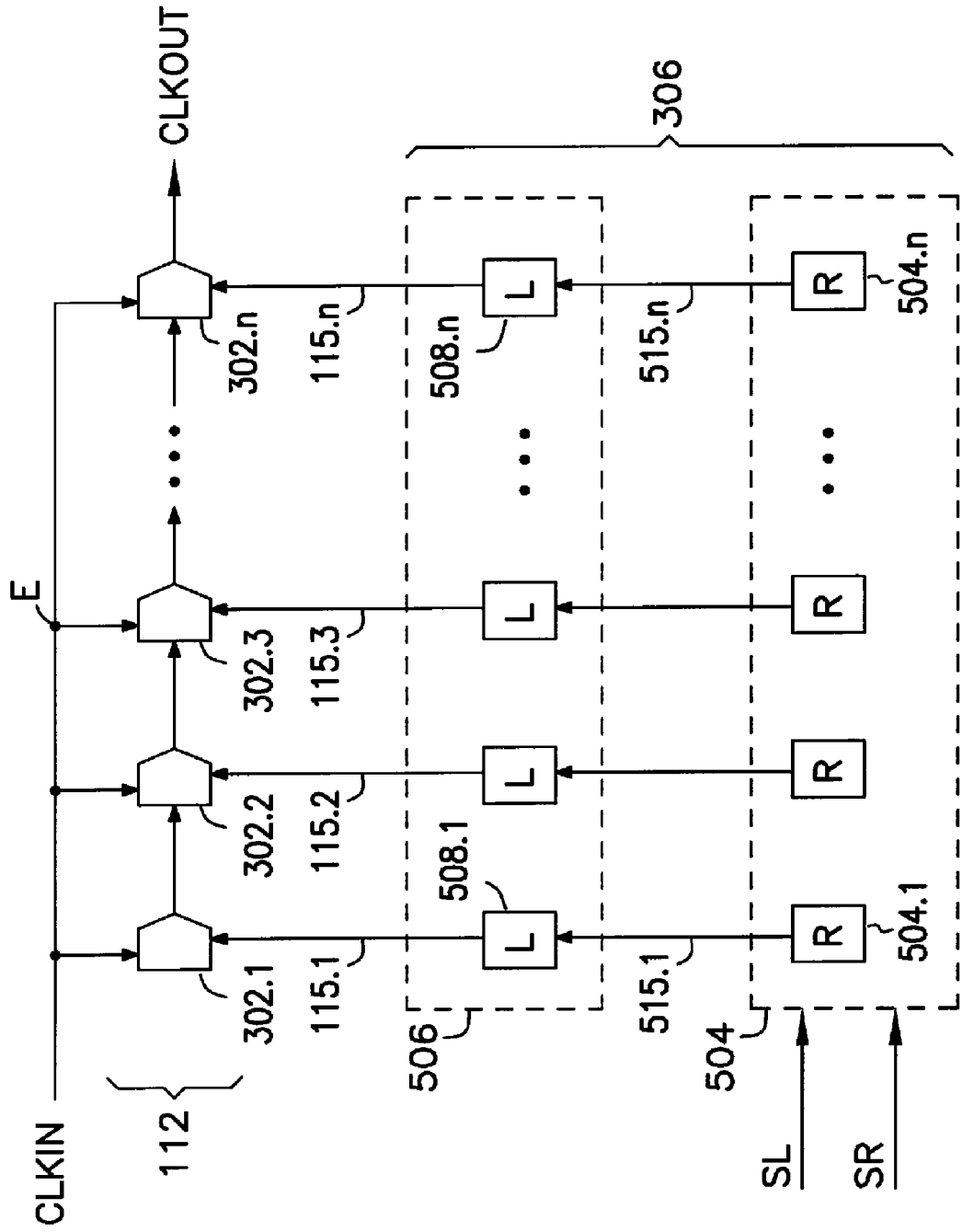
FIG. 5 shows a delay line and an adjusting unit of FIG. 3.

FIG. 5 shows delay line 112 and adjusting unit 306 of FIG. 3. Adjusting unit 306 includes a shift register 504 having a plurality of register cells (R) 504.1-504.n. Shift register 504 controls the contents of the register cells based on the SR and SL signals to activate the signals on tap lines 515.1-515.n. A select logic circuit 506 has a plurality of latches (L) 508.1-508.n, each connecting to a corresponding shift line. The signal on each shift line controls the content of a corresponding latch. Select logic circuit 506 selects tap lines 115.1-115.n based on the contents of latches 508.1-508.n to adjust the delay applied by delay line 112.

The CLKOUT signal exits delay line 112 at a fixed exit point from the output of delay element 302.n. The CLKIN signal is present at all of the delay elements, but only one of the delay elements allows it to enter at one entry point based on one of the selected tap lines 115.1-115.n. For example, when tap line 115.3 is selected, delay element 302.3 allows the CLKIN signal to enter delay line 112 at an entry point E. The CLKIN signal propagates from delay element 302.3 to delay element 302.n and becomes the CLKOUT signal. The entry point E moves along the inputs of delay elements 302.1-302.n when adjusting unit 306 adjusts the delay. The entry point E remains at the same position while the XCLK and DLLCLK (FIG. 3) are synchronized.

In the above example, delay elements 302.3 through 302.n are activated delay elements; they toggle at each edge of the CLKIN signal. The number of activated delay elements varies when the entry point E moves to a different position. The number of activated delay elements is fixed while the XCLK and DLLCLK are synchronized.

Figure 6:
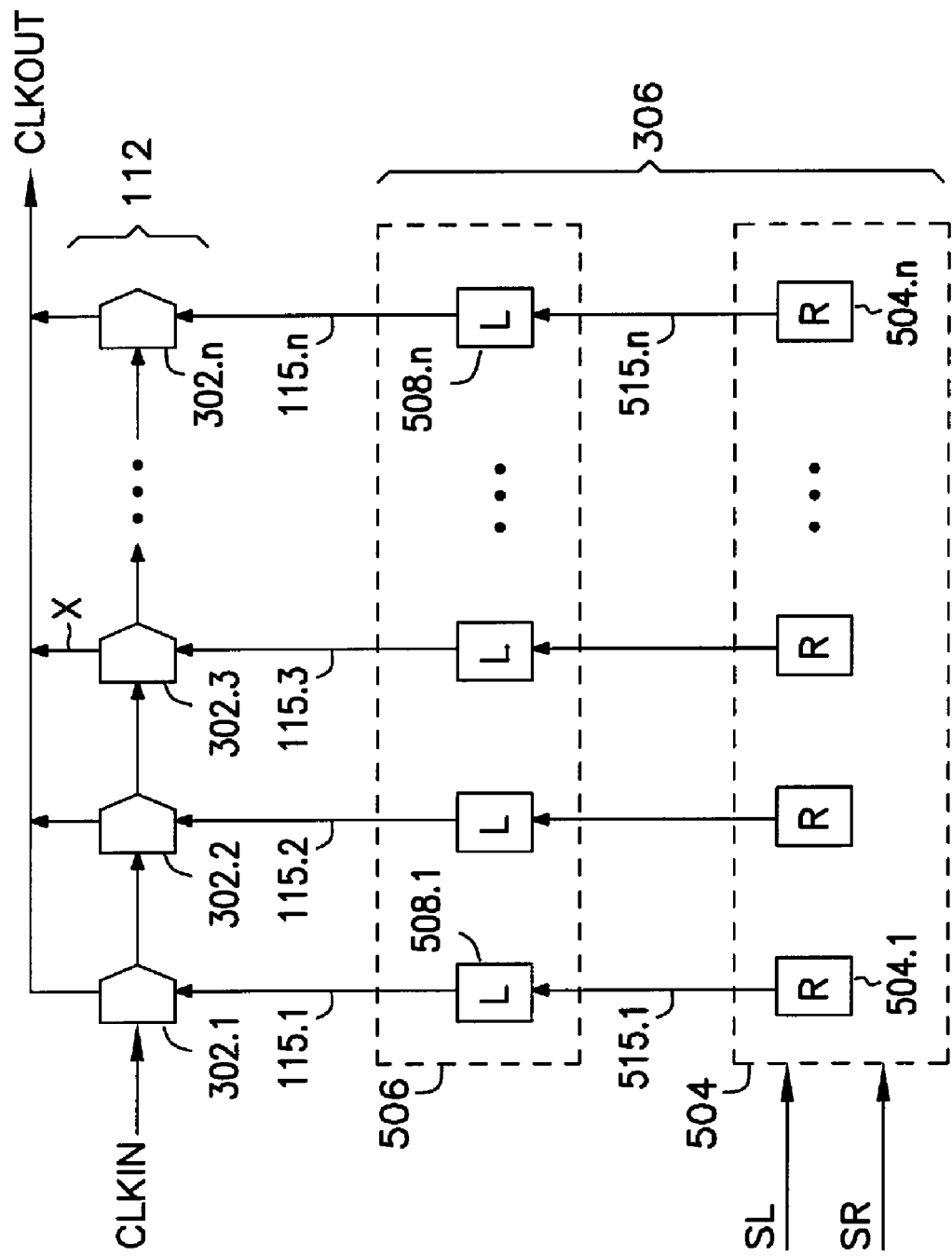
FIG. 6 shows a variation of the delay line and the adjusting unit of FIG. 5.

FIG. 6 shows a variation of the delay line and the adjusting unit of FIG. 5. Delay line 112 and adjusting unit 306 of FIG. 5 and FIG. 6 have similar elements. In FIG. 6, The CLKOUT signal exits delay line 112 at any one of the exit points from the outputs of delay elements 302.1.-302.n based on one of the selected tap lines 115.1-115.n. The CLKIN signal enters delay line 112 at a fixed point at delay element 302.1. For example, tap line 115.3 selects delay element 302.3 to allow the CLKOUT to exit delay line 112 at an exit point X. The CLKIN signal propagates from delay element 302.1 to delay element 302.3 and becomes the CLKOUT signal. The exit point X moves along the outputs of delay elements 302.1-302.n when adjusting unit 306 adjusts the delay. The exit point X remains at the same position while the XCLK and DLLCLK (FIG. 3) are synchronized.

In the example in FIG. 6, delay elements 302.1 through 302.3 are activated delay elements and toggle at each edge of the CLKIN signal. The number of activated delay elements varies when the exit point X moves to a different position. The number of activated delay elements is fixed while the XCLK and DLLCLK are synchronized.

Figure 7:
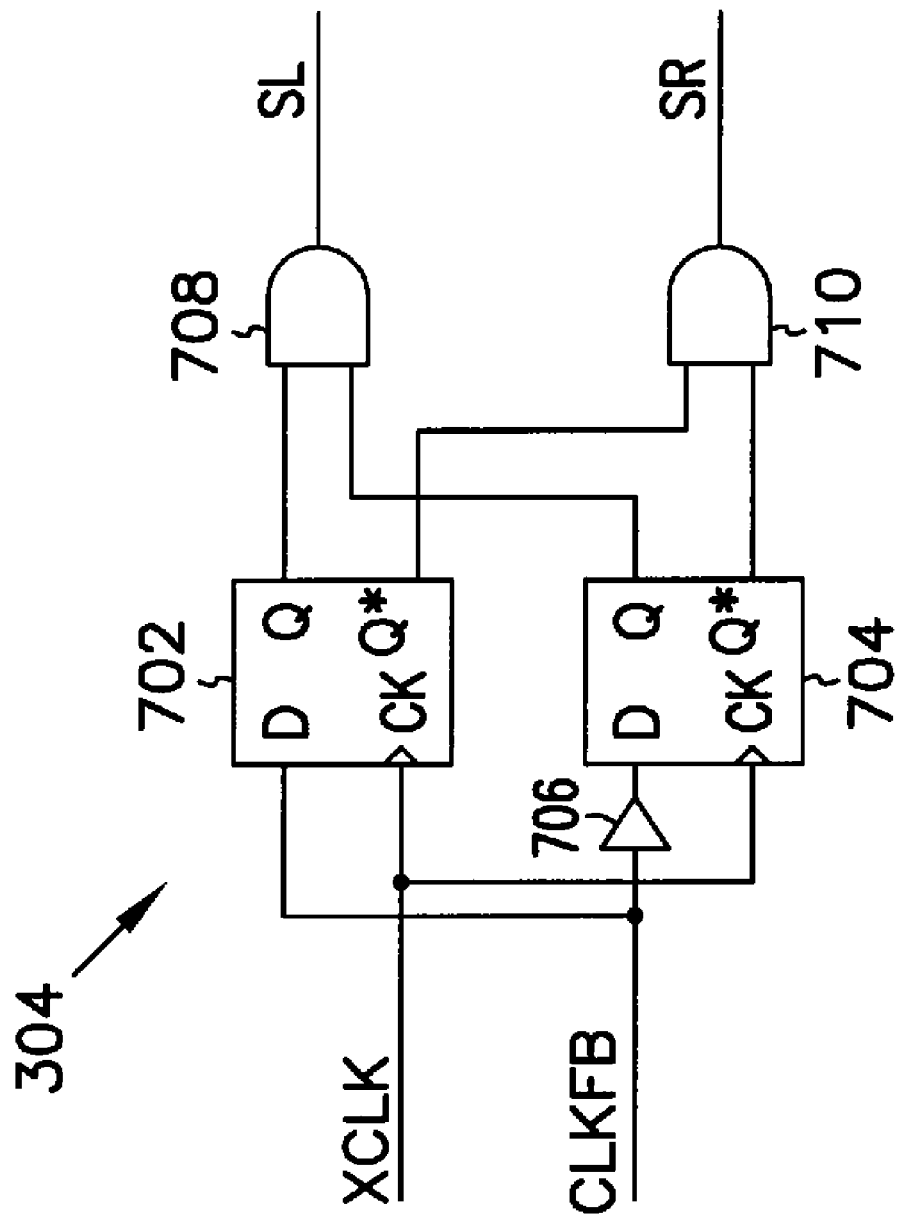
FIG. 7 shows a phase detector according to an embodiment of the invention.

FIG. 7 shows a phase detector according to an embodiment of the invention. Phase detector 304 includes flip flops 702 and 704, each having inputs D and CK and outputs Q and Q*. In some embodiments, flip flops 702 and 704 are D-Q flip flops. Input D of flip flop 702 receives the CLKFB signal and input D of flip flop 704 receives a delay version of the CLKFB signal through a delay 706. Both outputs Q connect to an AND gate 708. Both outputs Q* connect to an AND gate 710.

Both inputs CK of the flip flops receive the XCLK signal. In some embodiments, delay 706 has a delay equal to the delay of each of delay elements 302.1-302.n (FIG. 3).

Flip flops 702 and 704, delay 706, and AND gates 708 and 710 form a comparator for comparing the XCLK and CLKFB signals to activate the SR and SL signals. The SR signal is activated when the rising edges of the XCLK and CLKFB signals are separated by more than 180 degrees and less than 360 degrees. The SL signal is activated when the rising edges of the XCLK and CLKFB signals are separated by more than zero degree and less than or equal to 180 degrees.

Figure 8:
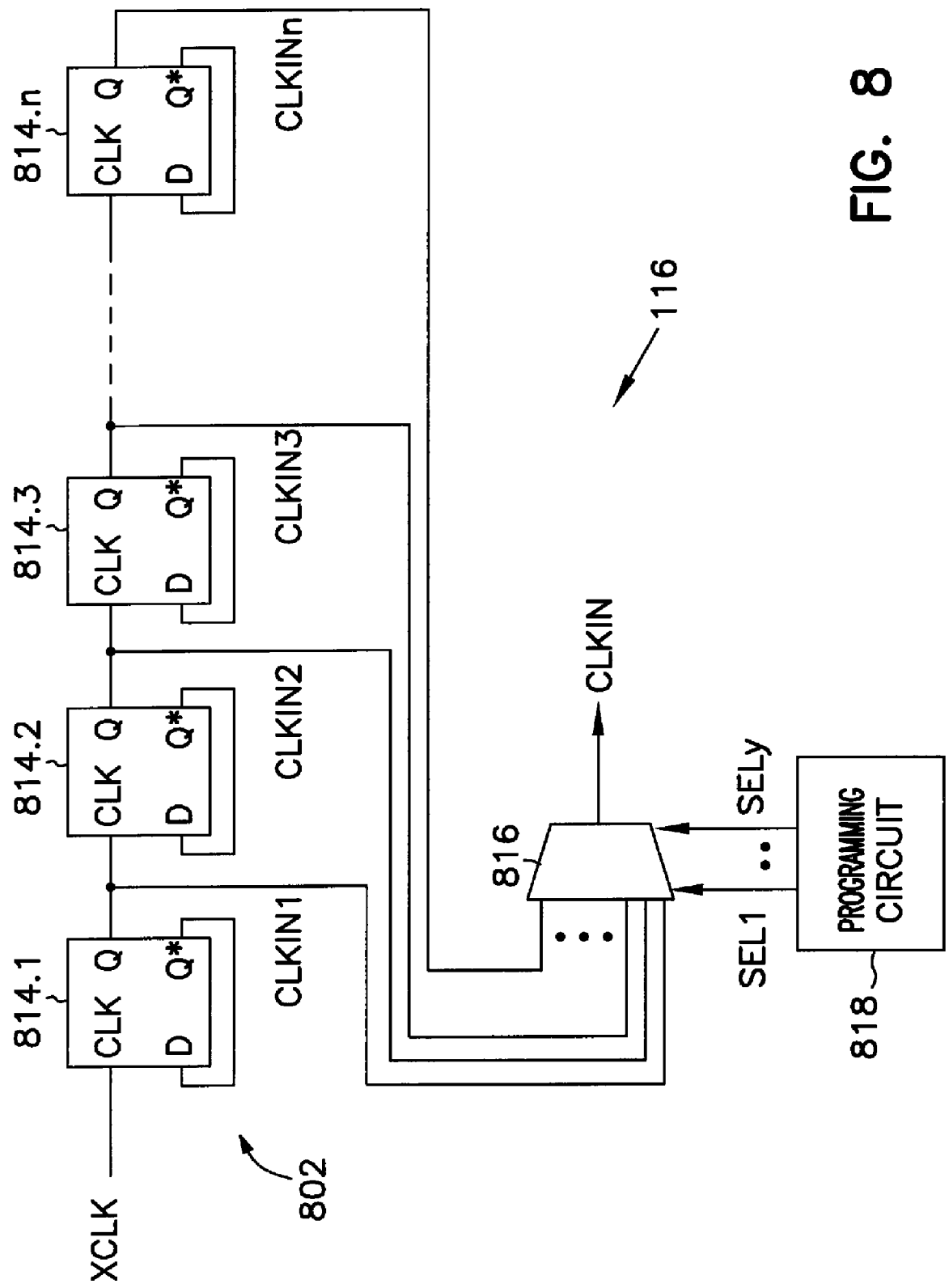
FIG. 8 shows an input cycle controller according to an embodiment of the invention.

FIG. 8 shows an input cycle controller according to an embodiment of the invention. Input cycle controller 116 includes an input frequency modifier 802 and a selector 816. Input frequency modifier 802 has a plurality of flip flops 814.1 through 814.n forming a frequency divider to divide the frequency of the XCLK signal.

Each of the flip flops 814.1-814.n has two input nodes CLK and D, and two output nodes Q and Q*. In some embodiments, each of the flip flops 814.1-814.n is a D-Q flip flop. Flip flops 814.1-814.n divide the XCLK signal into a plurality of selectable start signals CLKIN1-CLKINn, Each succeeding selectable start signal has a cycle time equal to twice the cycle time of the preceding selectable start signal. The CLKINn signal has a cycle time equaled to $2^n$ times the cycle time of the XCLK signal, where n is the total number of flip flops 814.1-814.n.

A selector 816 selects one of the CLKIN1-CLKINn signals as the CLKIN signal based on a combination of select signals SEL1-SELy. In some embodiments, selector 816 is a n:1 multiplexor. A programming circuit 818 sets the combination of the SEL1-SELy signals. Programming circuit 818 includes fuse devices, electrical fuse devices, laser fuse devices, storage elements, or other programmable elements. These elements are programmed to set a combination of the SEL1-SELy signals.

Figure 9:
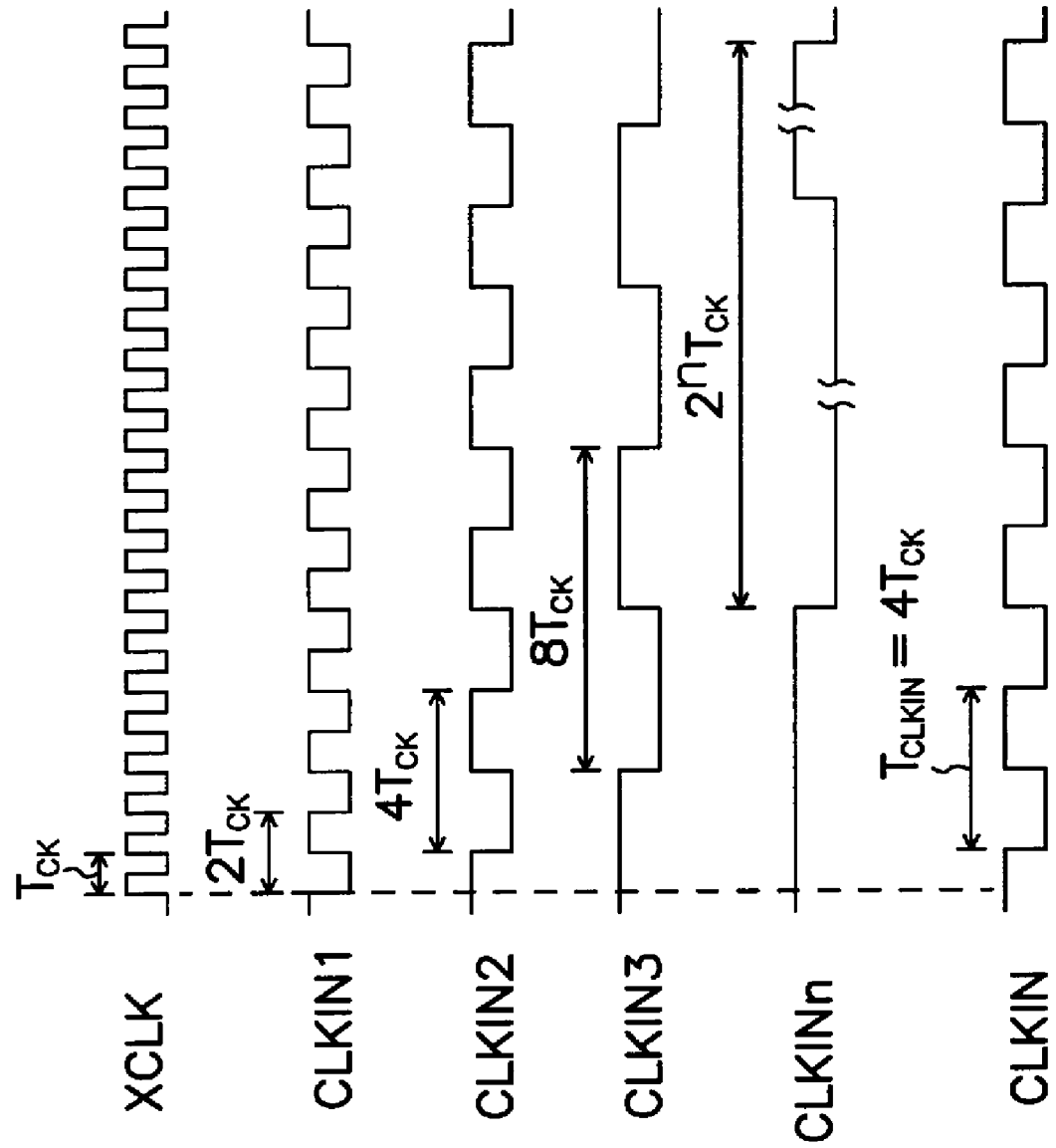
FIG. 9 is a timing diagram for FIG. 8.

FIG. 9 is a timing diagram for FIG. 8. For clarity, FIG. 9 shows only the CLKIN1, CLKIN2, CLKIN3, and CLKINn signals. The XCLK signal has a cycle time $T_{CK}$. The CLKIN1 signal has a cycle time equaled to $2^1$ times $T_{CK}$ ($2\ T_{CK}$). The CLKIN2 signal has a cycle time equaled to $2^2$ times $T_{CK}$ ($4\ T_{CK}$) The CLKIN3 signal has a cycle time equaled to $2^3$ times $T_{CK}$ ($8\ T_{CK}$). The CLKINn has a cycle time of $2^n$ times $T_{CK}$. In embodiments represented by FIG. 9, the CLKIN signal is selected from the CLKIN2 signal as an example. In other embodiments, the CLKIN signal can be selected from any one of the CLKIN1-CLKINn signals.

Figure 10:
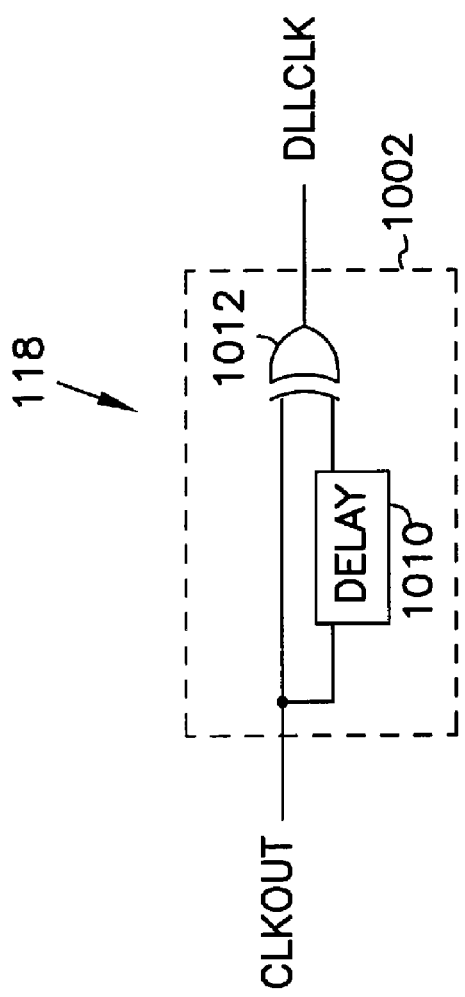
FIG. 10 shows an output cycle controller according to an embodiment of the invention.

FIG. 10 shows an output cycle controller according to an embodiment of the invention. Output cycle controller 118 includes an output frequency modifier 1002 for modifying the frequency of the CLKOUT signal. Output frequency modifier 1002 has a delay component 1010 and an exclusive OR gate 1012 forming a frequency multiplier to multiply the frequency of the CLKOUT signal to generate the DLLCLK signal. The delay of delay component 1010 can be selected such that the cycle time of the DLLCLK signal is smaller than the cycle time of the CLKOUT signal.

Figure 11:
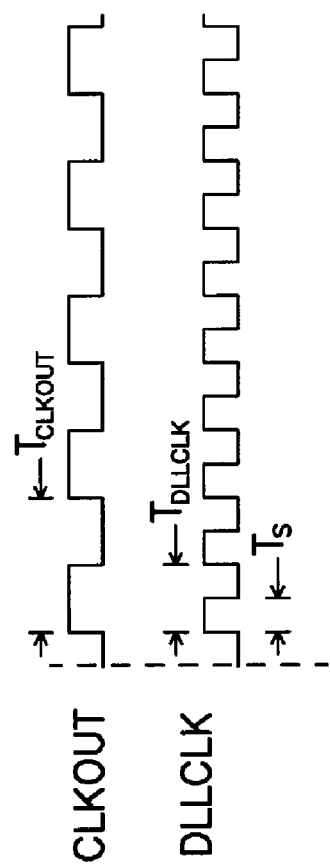
FIG. 11 is a timing diagram for FIG. 10.

FIG. 11 is a timing diagram for cycle controller 118 of FIG. 10. $T_{CLKOUT}$ is the cycle time of the CLKOUT signal. $T_{DLLCLK}$ is the cycle time of the DLLCLK signal; $T_{DLLCLK}$ is smaller than $T_{CLKOUT}$. $T_S$ indicates a time that the DLLCLK signal is at a certain signal level. In FIG. 1, $T_S$ indicates a time that the DLLCLK signal is high. In some embodiments, $T_S$ indicates a time that the DLLCLK signal is low.

$T_S$ can be adjusted by selecting the delay of delay component 1010 (FIG. 10). In some embodiments, the delay of delay component 1010 is selected such that $T_S$ is one-half of $T_{DLLCLK}$ so that the DLLCLK signal has a 50% duty cycle. In other embodiments, the delay of delay component 1010 can be selected such that $T_S$ equals a fraction of $T_{DLLCLK}$ other than one-half $T_{DLLCLK}$.

Figure 12:
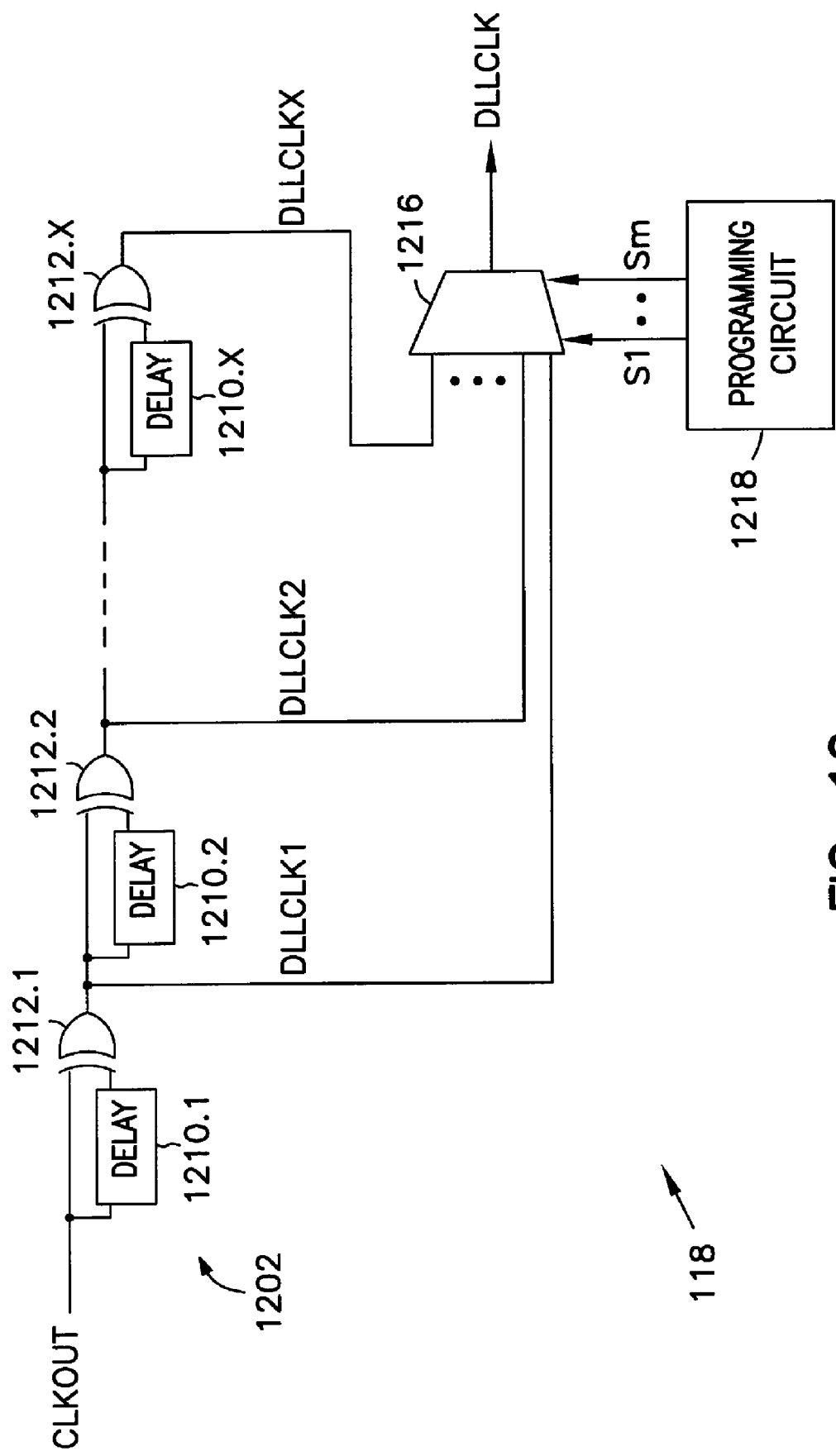
FIG. 12 shows an output cycle controller according to another embodiment of the invention.

FIG. 12 shows an output cycle controller according to another embodiment of the invention. Output cycle controller 118 includes an output frequency modifier 1202 for modifying the frequency of the CLKOUT signal. Output frequency modifier 1202 has a plurality of delay components 1210.1-1210.X and a plurality of exclusive OR gates 1212.1-1212.X. These delay components and gates form a frequency multiplier for multiplying the frequency of the CLKOUT signal to generate a plurality of selectable internal signals DLLCLK1-DLLCLKX; each succeeding selectable internal signal has a cycle time that is less than the cycle time of the preceding selectable internal signal. The DLLCLKX signal has a cycle time equaled to ($\frac{1}{2}^X$) times the cycle time of the CLKOUT signal, where X is the total number of gates 1212.1-1212.X.

A selector 1216 selects one of the DLLCLK1-DLLCLKX signals as the DLLCLK signal based on a combination of select signals S1-Sm. In some embodiments, selector 1216 is a X:1 multiplexor. A programming circuit 1218 sets the combination of the S1-Sm signals. Programming circuit 1218 includes fuse devices, electrical fuse devices, laser fuse devices, storage elements, or other programmable elements. These elements are programmed to set a combination of the S1-Sm signals.

Figure 13:
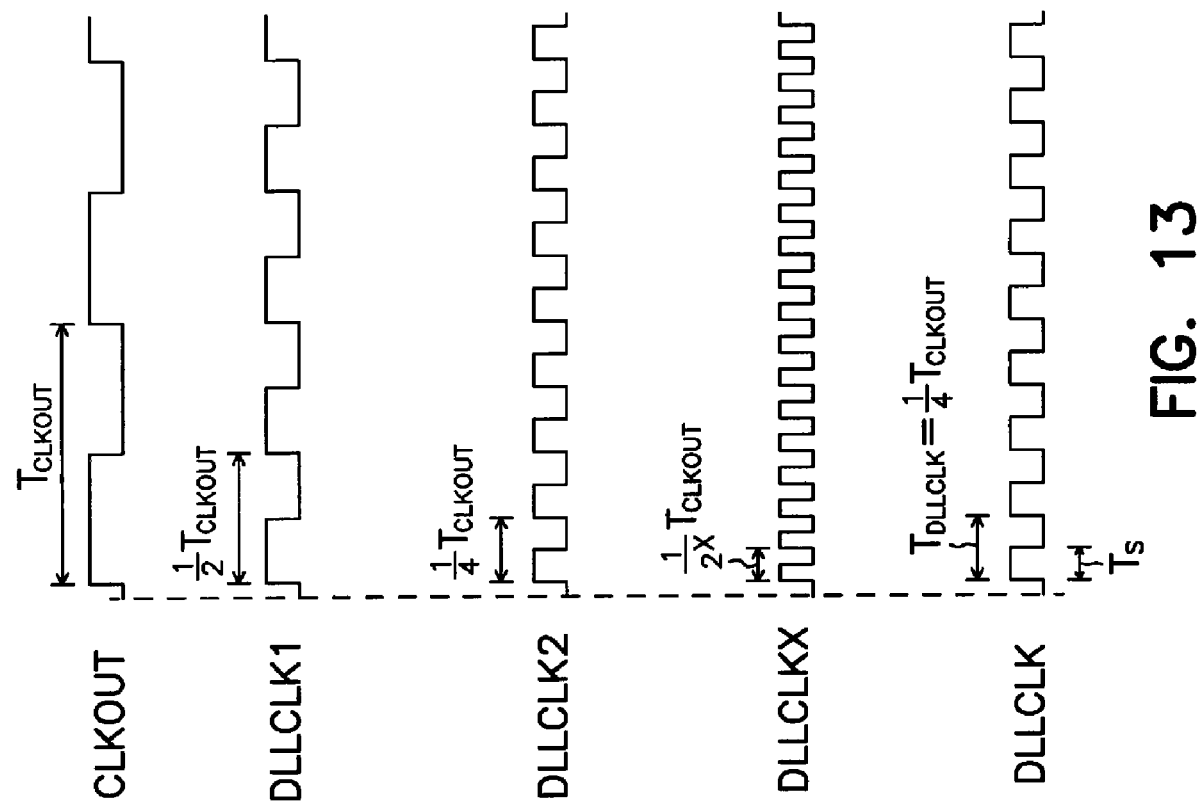
FIG. 13 is a timing diagram for FIG. 12.

FIG. 13 is a timing diagram for FIG. 12. For clarity, FIG. 13 shows only the DLLCK1, DLLCLK2, and DLLCLKX signals. The CLKOUT signal has a cycle time $T_{CLKOUT}$. The DLLCLK1 signal has a cycle time equaled to $\frac{1}{2}\ T_{CLKOUT}$. The DLLCLK2 signal has a cycle time equaled to ¼ TCLKOUT. The DLLCLKX signal has a cycle time equaled to $\frac{1}{2}^X\ T_{CLKOUT}$. In embodiments represented by FIG. 13, the DLLCLK signal is selected from the DLLCLK2 signal as an example. In this example, the cycle time of the DLLCLK signal, $T_{DLLCLK}$, equals ¼ $T_{CLKOUT}$. In other embodiments, the DLLCLK signal can be selected from any one of the DLLCLK1-DLLCLKX signals.

$T_S$ indicates a time that the DLLCLK signal is at a certain signal level. $T_S$ can be adjusted by selecting the delays of delay components 1210.1-1210.X (FIG. 12). For example, the delays of delay components 1210.1-1210.X can be selected such that $T_S$ is one-half of $T_{DLLCLK}$ so that the DLLCLK signal has a 50% duty cycle. As another example, the delays of delay components 1210.1-1210.X can be selected such that $T_S$ equals a fraction of $T_{DLLCLK}$ other than one-half $T_{DLLCLK}$.

Figure 14:
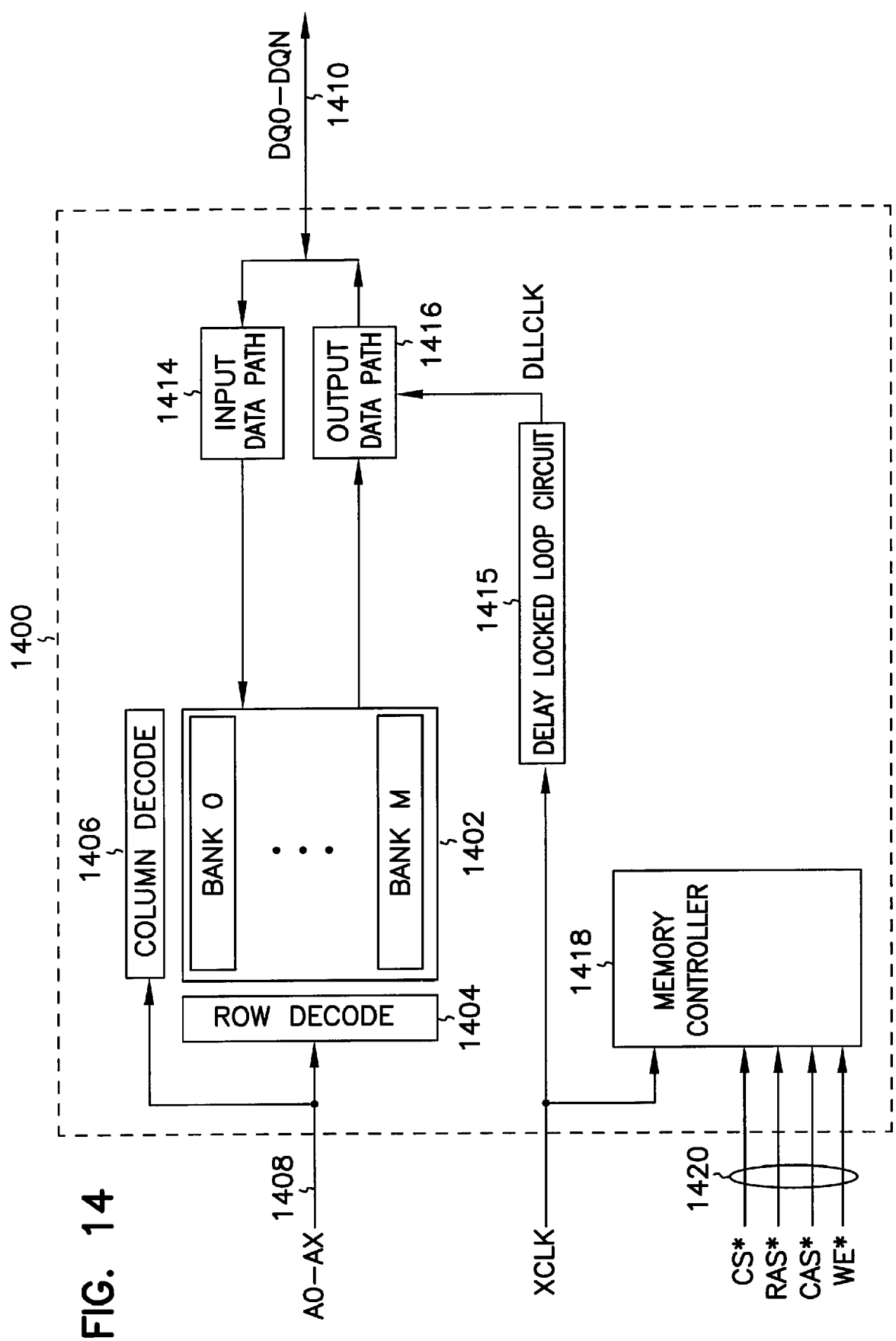
FIG. 14 shows a memory device according to an embodiment of the invention.

FIG. 14 shows a memory device according to an embodiment of the invention. Memory device 1400 includes a main memory 1402 having a plurality of memory cells arranged in rows and columns. The memory cells are grouped into a plurality of memory banks indicated by bank 0 through bank M. Row decode 1404 and column decode 1406 access the memory cells in response to address signals A0 through AX (A0-AX) on address lines (or address bus) 1408. A data input path 1414 and a data output path 1416 transfer data between banks 0-M and data lines (or data bus) 1410. Data lines 1410 carry data signals DQ0 through DQN. A memory controller 1418 controls the modes of operations of memory device 1400 based on control signals on control lines 1420. The control signals include, but are not limited to, a Chip Select signal CS*, a Row Access Strobe signal RAS*, a Column Access Strobe CAS* signal, a Write Enable signal WE*, and an external clock signal XCLK.

Memory device 1400 further includes a DLL 1415 having a delay line for receiving the XCLK signal to generate an internal signal DLLCLK. The DLLCLK signal serves as a clock signal to control a transfer of data on data output path 1416. DLL 1415 includes cycle control circuitry for controlling the cycle time of the signal entering the delay and the cycle time of the signal exiting the delay line. DLL 1415 includes embodiments of DLL 100 (FIG. 1 and FIG. 3).

In some embodiments, memory device 1400 is a dynamic random access memory (DRAM) device. In other embodiments, memory device 1400 is a static random access memory (SRAM), or flash memory. Examples of DRAM devices include synchronous DRAM commonly referred to as SDRAM (synchronous dynamic random access memory), SDRAM II, SGRAM (synchronous graphics random access memory), DDR SDRAM (double data rate SDRAM), DDR II SDRAM, and Synchlink or Rambus DRAMs. Those skilled in the art recognize that memory device 1400 includes other elements, which are not shown for clarity.

Figure 15:
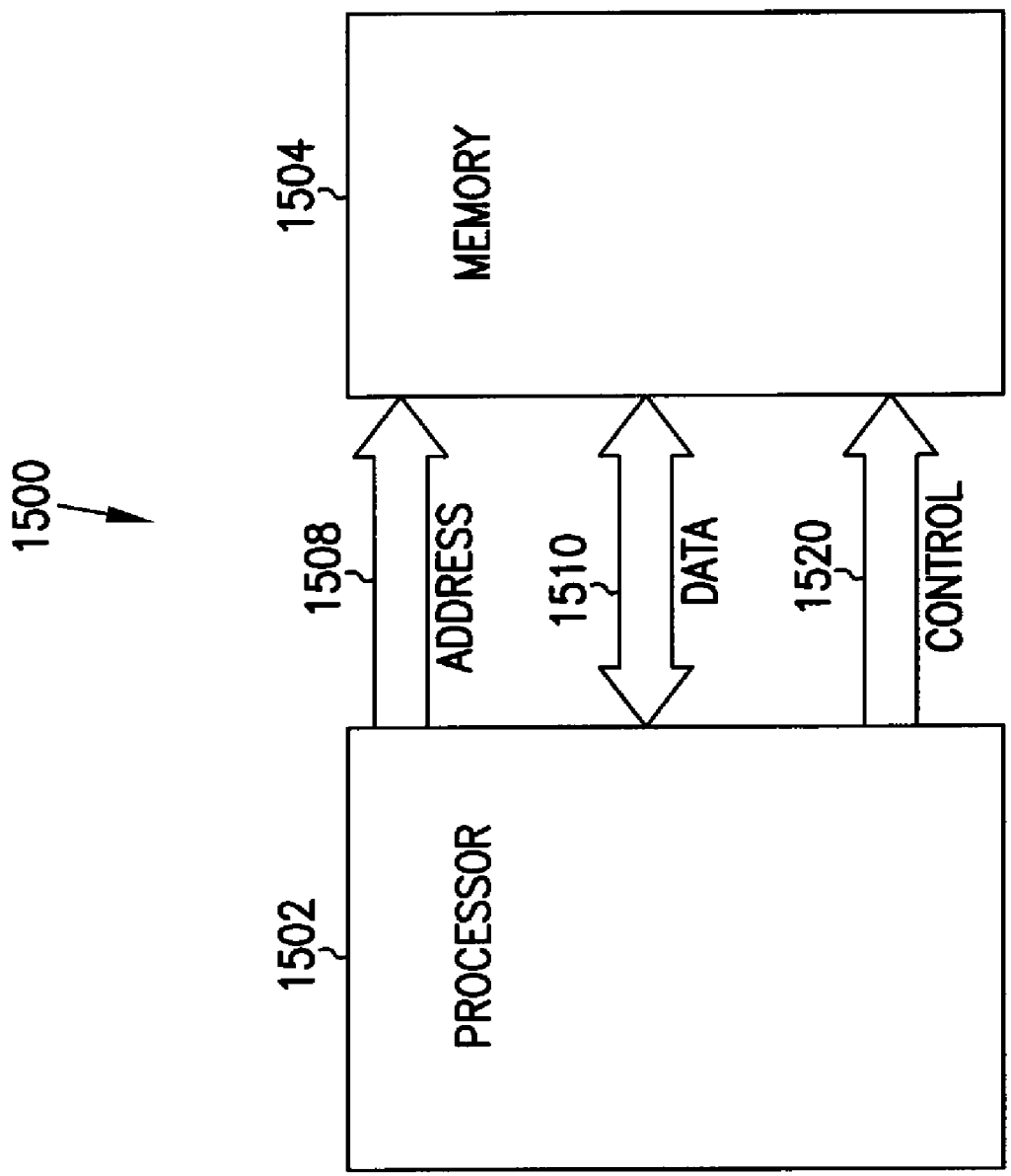
FIG. 15 shows a system according to an embodiment of the invention.

FIG. 15 shows a system 1500 according to an embodiment of the invention. System 1500 includes a first integrated circuit (IC) 1502 and a second IC 1504. IC 1502 and IC 1504 can include processors, controllers, memory devices, application specific integrated circuits, and other types of integrated circuits. In FIG. 15, IC 1502 represents a processor and IC 1504 represents a memory device. Processor 1502 and memory device 1504 communicate using address signals on lines 1508, data signals on lines 1510, and control signals on lines 1520.

Memory device 1504 includes embodiments of memory device 1400 (FIG. 14) including DLL 1415, which corresponds to DLL 100 (FIG. 1 and FIG. 3).

System 1500 includes computers (e.g., desktops, laptops, hand-helds, servers, Web appliances, routers, etc.), wireless communication devices (e.g., cellular phones, cordless phones, pagers, personal digital assistants, etc.), computer-related peripherals (e.g., printers, scanners, monitors, etc.), entertainment devices (e.g., televisions, radios, stereos, tape and compact disc players, video cassette recorders, camcorders, digital cameras, MP3 (Motion Picture Experts Group, Audio Layer 3) players, video games, watches, etc.), and the like.

CONCLUSION

Various embodiments of the invention provide circuits and methods to operate a DLL more efficiently. In one aspect, the DLL includes a forward path for receiving an external signal to generate an internal signal. The forward path includes a delay line for applying a delay to an input signal derived from the external signal to output an output signal. An input cycle controller controls a time interval between edges of the input signal. An output cycle controller modifies a time interval between edges of the output signal. The DLL also includes a feedback path and a delay controller. The feedback path provides a feedback signal derived from the output signal. The delay controller adjusts the delay based on the feedback and input signals to synchronize the external and internal signals. In another aspect, a method of processing signals includes modifying a cycle time of an external signal to produce an input signal. The method also applies a delay to the input signal to produce an output signal. An internal signal is generated based on the output signal. The method further adjusts the delay to synchronize the external and internal signals. Other embodiments are described and claimed.

Although specific embodiments are described herein, those skilled in the art recognize that other embodiments may be substituted for the specific embodiments shown to achieve the same purpose. This application covers any adaptations or variations of the embodiments of the invention. Therefore, the embodiments of the invention are limited only by the claims and all available equivalents.

What is claimed is:

1. A memory device comprising:
   a first node receiving a first signal;
   a second node for providing an input signal based on the first signal;
   a plurality of delay elements for applying a delay to the input signal to provide an output signal;
   an input circuit for controlling a cycle time of the input signal;
   an output circuit for controlling a cycle time of the output signal to provide a second signal;
   a delay circuit for delaying the second signal to provide a feedback signal, wherein the delay circuit includes a time delay to match a sum of a time delay of the input circuit and a time delay of the output circuit; and
   a controller for adjusting the delay to control a timing relationship between the feedback signal and the first signal.

2. The memory device of claim 1, wherein the controller includes:
   a comparator for providing shifting signals based on the feedback signal and the first signal; and
   a shift register adjusting the delay based on the shifting signals.

3. The memory device of claim 1, wherein the input circuit includes a unit for generating a plurality of selectable input signals based on the first signal, wherein each of the selectable input signals has a cycle time greater than a cycle time of the first signal.

4. The memory device of claim 3 further includes a selector for selecting one of the selectable input signals to be the input signal.

5. The memory device of claim 1, wherein the output circuit includes a unit for generating a plurality of selectable output signals based on the output signal, and wherein each of the selectable output signals has a cycle time smaller than a cycle time of the input signal.

6. The memory device of claim 5 further includes a selector for selecting one of the selectable output signals to be the second signal.

7. The memory device of claim 1, wherein the input circuit includes a frequency divider for receiving the first signal to generate a plurality of selectable input signals based on the first signal, wherein the input signal is one of the selectable input signals.

8. The memory device of claim 7, wherein the input circuit includes a frequency multiplier for receiving the output signal to generate a plurality of selectable output signals based on the output signal, and wherein the second signal is one of the selectable output signal signals.

9. A memory device comprising:
   a first node to receive a first signal, the first signal having a first cycle time;
   an input circuit to provide an input signal based on the first signal, the input signal having a second cycle time;
   a delay line to apply a delay to the input signal to provide an output signal, the output signal having the second cycle time;
   an output circuit to provide a second signal based on the output signal, the second signal having a third cycle time;
   a delay circuit to delay the second signal to provide a feedback signal, the feedback signal having the third cycle time; and a controller to adjust the delay based on a timing relationship between the feedback signal and the first signal.

10. The memory device of claim 9, wherein the input circuit includes a first frequency modifier to cause the second cycle time to be greater than the first cycle time.

11. The memory device of claim 10, wherein the output circuit includes a second frequency modifier to cause the third cycle time to be smaller than the second cycle time.

12. The memory device of claim 10, wherein output circuit includes a second frequency modifier is to match the third cycle time with the first cycle time.

13. The memory device of claim 9, wherein the input circuit includes a frequency divider to cause the second cycle time to be greater than the first cycle time.

14. The memory device of claim 13, wherein the output circuit includes a frequency multiplier to cause the third cycle time to be less than the second cycle time and to cause the third cycle time to match the first cycle time.

* * * * *

UNITED STATES PATENT AND TRADEMARK OFFICE
CERTIFICATE OF CORRECTION

PATENT NO.         : 7,489,587 B2                                          Page 1 of 1
APPLICATION NO. : 11/458631
DATED              : February 10, 2009
INVENTOR(S)        : Bell et al.

It is certified that error appears in the above-identified patent and that said Letters Patent is hereby corrected as shown below:

In column 8, line 49, in Claim 8, delete "input" and insert -- output --, therefor.

In column 8, line 53, in Claim 8, after "output" delete "signal".

In column 9, line 9, in Claim 12, after "wherein" insert -- the --.

In column 9, line 10, in Claim 12, after "modifier" delete "is".

Signed and Sealed this

Twenty-eighth Day of April, 2009

JOHN DOLL
*Acting Director of the United States Patent and Trademark Office*